United States Patent

Feldmann et al.

[11] Patent Number: 6,032,088

[45] Date of Patent: Feb. 29, 2000

[54] METHOD FOR CHECKING VEHICLE COMPONENT SYSTEMS IN MOTOR VEHICLES

[75] Inventors: Ekkehard Feldmann, Hemmingen; Eberhard Frech, Kirchheim; Bernhard Schray, Oberriexingen; Thomas Edelmann, Bietigheim-Bissingen, all of Germany

[73] Assignee: Robert Bosch GmbH, Stuttgart, Germany

[21] Appl. No.: 08/875,248

[22] PCT Filed: Jul. 10, 1996

[86] PCT No.: PCT/DE96/01242

§ 371 Date: Jul. 2, 1997

§ 102(e) Date: Jul. 2, 1997

[87] PCT Pub. No.: WO97/17618

PCT Pub. Date: May 15, 1997

[30] Foreign Application Priority Data

Nov. 3, 1995 [DE] Germany ............. 195 40 943

[51] Int. Cl.[7] .................... G01M 17/00; G01M 19/00
[52] U.S. Cl. .................... 701/33; 73/117.3; 73/118.1; 701/29
[58] Field of Search .................... 701/1, 35, 26, 701/9, 33, 39, 63, 29; 73/116, 117.2, 117.3, 118.1

[56] References Cited

U.S. PATENT DOCUMENTS

| 4,267,569 | 5/1981 | Baumann et al. | 73/116 |
| 4,794,790 | 1/1989 | Margarit-Metaxa et al. | 73/117.3 |
| 5,005,129 | 4/1991 | Abe et al. | 73/116 |
| 5,506,773 | 4/1996 | Takaba et al. | 701/35 |
| 5,671,141 | 9/1997 | Smith et al. | 701/1 |
| 5,737,711 | 4/1998 | Abe | 701/35 |

FOREIGN PATENT DOCUMENTS

| 0553472 | 8/1993 | European Pat. Off. |
| 4333009 | 3/1995 | Germany . |
| WO90/13738 | 11/1990 | WIPO . |

*Primary Examiner*—George Dombroske
*Attorney, Agent, or Firm*—Walter Ottesen

[57] ABSTRACT

An on-board diagnostic arrangement is disclosed for checking component systems of a motor vehicle by test functions which are triggered during operation of the motor vehicle under predetermined start conditions. The test functions are characterized in that at least one signal can be coupled into the arrangement via which the triggering of the test functions by the arrangement is inhibited and in that at least one test function, which is carried out by the arrangement, is triggered independently of the predetermined start conditions and/or can be modified in its sequence. The arrangement makes possible a shortening of the check of component systems at the end of an assembly line or after customer service because satisfying time-consuming start conditions for the normal operation of the test functions can be omitted.

6 Claims, 2 Drawing Sheets

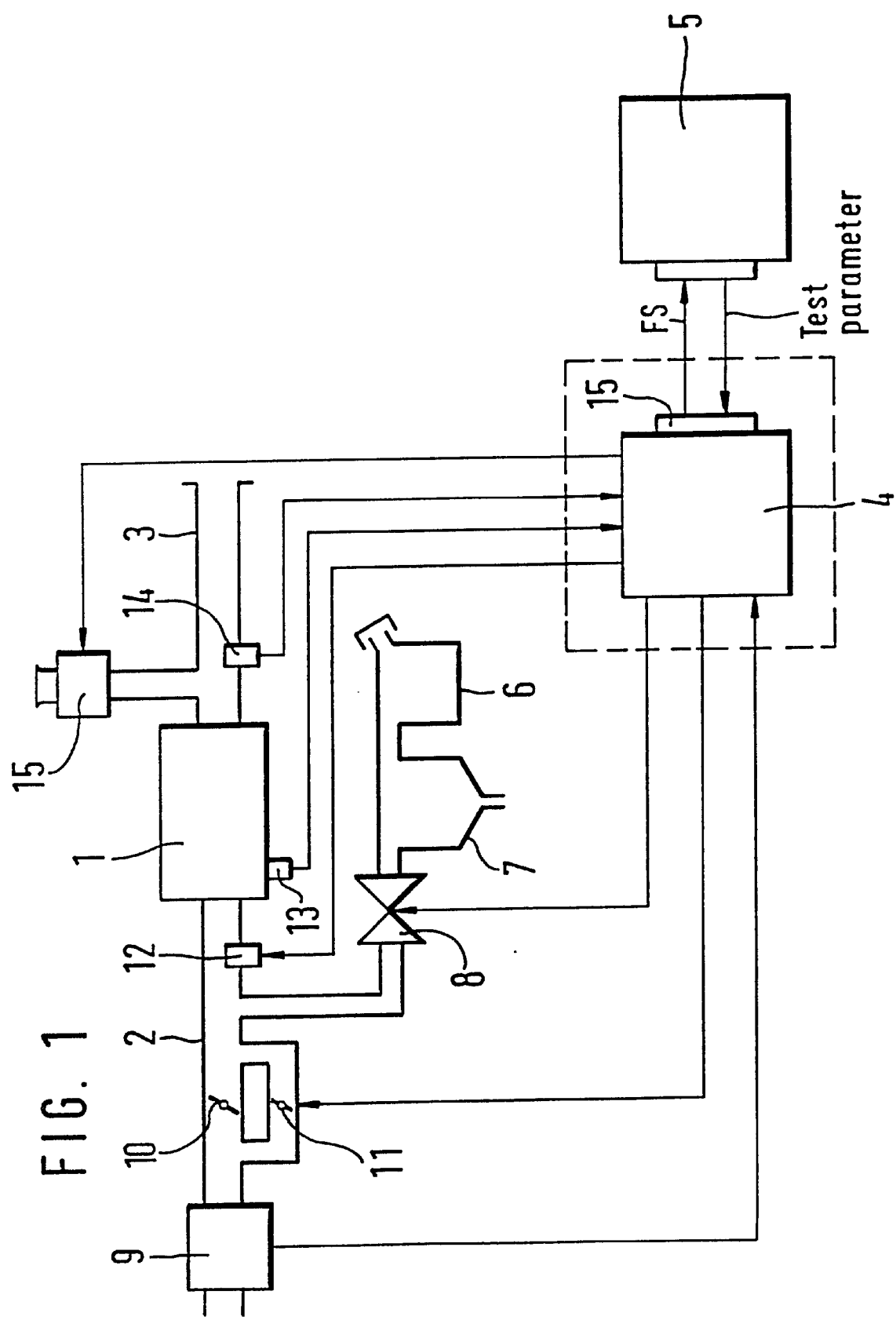

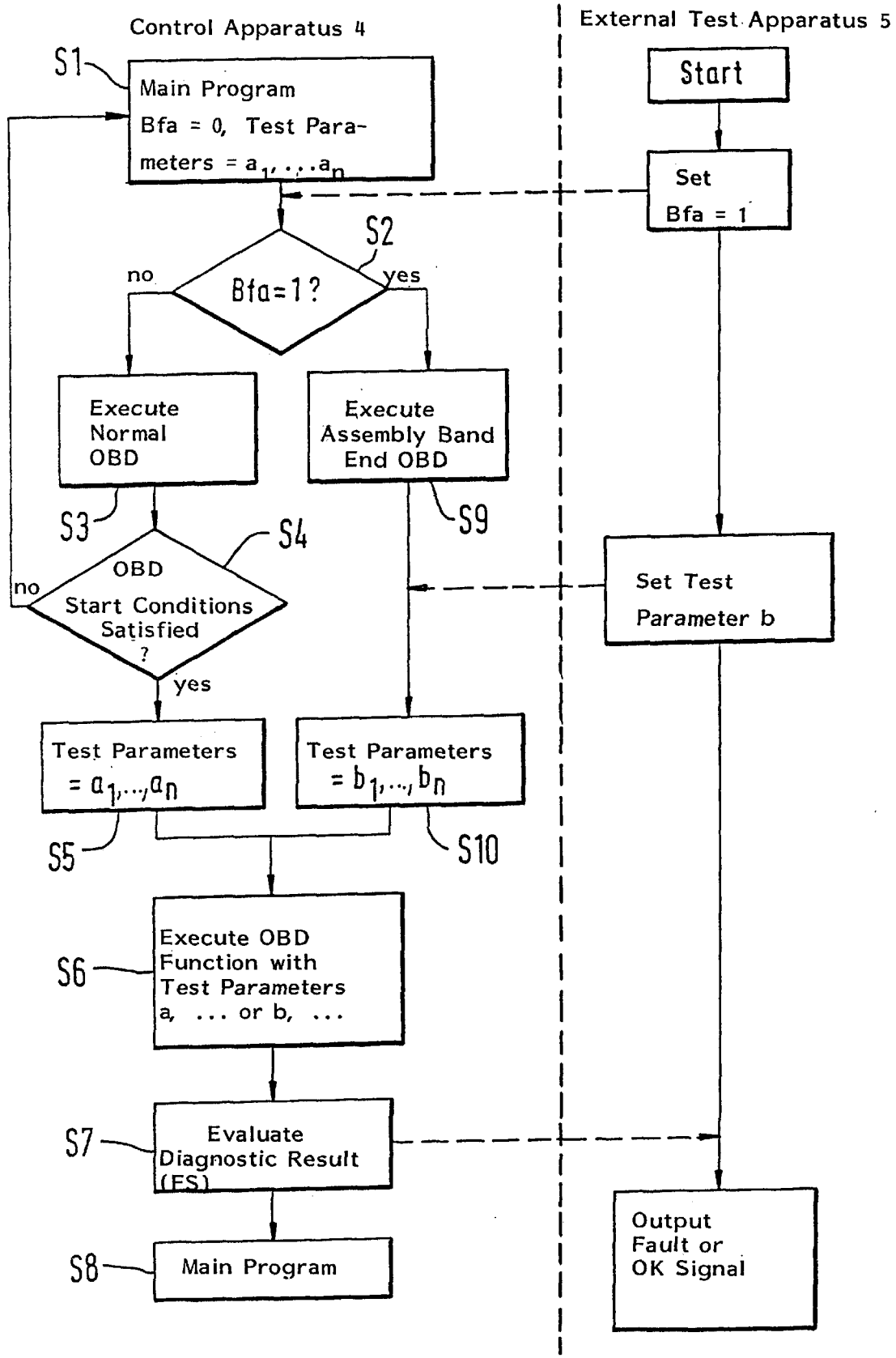

METHOD FOR CHECKING VEHICLE COMPONENT SYSTEMS IN MOTOR VEHICLES

FIELD OF THE INVENTION

The invention relates to a method for checking the component systems in motor vehicles, which are equipped with on-board diagnostic systems, at the end of the manufacturing process as well as for customer service.

BACKGROUND OF THE INVENTION

Modern motor vehicles are equipped with so-called on-board diagnostic systems because of statutorily mandated requirements. With the aid of these systems, the operability of exhaust-gas relevant vehicle component systems is monitored. One example of such a system is a tank-venting system having an active charcoal filter, a controllable tank-venting valve as well as associated line connections. An apparatus for on-board diagnosis of a tank-venting valve is described, for example, in U.S. Pat. No. 4,794,790.

It is customary to check these systems when first taking the vehicle into service with the aid of the on-board diagnostic functions. For this purpose, a driving curve of operating points having predetermined values of load, rpm and other parameters, if required, is run through under defined conditions on a test stand. The drive curve is so defined that the on-board diagnostic programs run through automatically. If an exhaust-gas relevant fault is registered, then this is stored as a fault announcement in the control apparatus and is signalized to the outside during or after the test run, for example, via an external tester so that measures can be taken to eliminate the fault.

The read-out of self-testing data in combination with a control at the end of the assembly line is, for example, known from VDI Berichten 612, page 392. The system presented there relates to the expansion of existing control apparatus with a suitable interface for the purpose of making the data of the self test of the control apparatus, for example, understandable to a service technician.

A high expenditure of time is associated with carrying out a driving curve which is adequate for triggering and carrying out the on-board diagnostic functions. This is so because the diagnostic functions designed for everyday operation are triggered by the control apparatus, for example, only after the elapse of a certain time span after the start of the vehicle. This time span can be in the range of minutes which is a very long time span for a test at the end of an assembly line.

SUMMARY OF THE INVENTION

The object of the invention is to provide an arrangement which shortens this test time while retaining the on-board diagnostic functions implemented in the known apparatus.

The arrangement according to the invention makes possible a simple function check of the component systems such as secondary-air blow-in and tank venting while considering all relevant components with reduced test time. The utilization of existing diagnostic functions makes unnecessary the implementation of self diagnostic functions provided only for the check at the end of the assembly line testing or for customer service testing. In this way, a reduction of the program complexity as well as an overall optimized structure of the control program of the diagnostic arrangement is achieved.

BRIEF DESCRIPTION OF THE DRAWINGS

The invention will now be described with reference to the drawings wherein.

FIG. 1 shows an internal combustion engine having a tank-venting system and a secondary-air system as examples of component systems which are to be checked with on-board means; and, FIG. 2 shows an embodiment of method steps which are carried out by the control apparatus 4 of FIG. 1 as an arrangement of the invention.

DESCRIPTION OF THE PREFERRED EMBODIMENTS OF THE INVENTION

The 1 in FIG. 1 identifies an internal combustion engine having an intake pipe 2, an exhaust-gas pipe 3, a tank-venting system, a secondary-air system and a control apparatus 4 as well as an external test apparatus 5.

The tank-venting system includes a tank 6, an active charcoal filter 7 and a tank-venting valve 8.

In the intake pipe 2, means 9 are provided for detecting the air quantity m, which is inducted by the engine, a throttle flap 10, a bypass to the throttle flap having an idle actuator 11 as well as a fuel-metering device 12.

A rpm sensor 13 on the engine as well as an exhaust-gas sensor 14 in the exhaust-gas pipe of the engine are shown as representative of further sensors for detecting operating variables of the engine.

An external test apparatus 5 communicates via an interface 15 with the vehicle control apparatus 4.

The control apparatus 4 mediates between the sensors shown and the actuators in a preprogrammed manner. Accordingly, the quantity m of the inducted air is, for example, normalized by division by the rpm (n) of the engine to individual strokes and a base value is formed therefrom for driving the fuel-metering device 12. This base value is so corrected in dependence upon the signal of the exhaust-gas measurement sensor 14 that a desired value of the composition of lambda of the air/fuel mixture combusted in the engine is adjusted in the time-dependent means. An idle control loop of rpm sensor and idle actuator 11 operates in parallel to this mixture control loop. If the rpm drops below a desired value, the control apparatus increases the air quantity, which is inducted by the engine, via the idle actuator and thereby increases the rpm of the engine.

Fuel vaporized in tank 6 is intermediately stored in the active charcoal filter 7. In driving operation, the tank-venting valve 8 is opened in accordance with control commands of the control apparatus 4 so that air is inducted via the active charcoal filter which entrains the intermediately-stored fuel and conducts the same to combustion.

The tank-venting system does not function, for example, when the tank-venting valve is defectively closed. In order to discover this defect with on-board means, it is known to maximally open the tank-venting valve and to evaluate the reaction of the lambda and/or rpm control loop. When the tank-venting valve is intact and with the active charcoal filter laden with fuel, the open command of the tank-venting valve causes an enrichment of the air/fuel mixture supplied to the engine which is registered via the exhaust-gas sensor. When the active charcoal filter is not laden with fuel, pure air is inducted via the tank-venting valve in the extreme case which leads to an increase of the rpm when the idle rpm control is switched off. If neither a lambda reaction nor an rpm reaction occurs, then this is evaluated as a defect and, for example, a fault announcement which indicates the fault is outputted or stored.

The secondary-air system can, for example, be checked in that the reaction of the lambda probe is observed when blowing in air. These on-board diagnostic programs are triggered during normal operation by control apparatus 4 when specific start conditions are present.

For example, it can be provided that this check is executed in everyday operation only after some time after the start of the engine. This leads to an unwanted expenditure of time when utilizing the on-board diagnostics at the end of the assembly line.

To shorten the test method at the end of the assembly line or for customer service, the diagnostic apparatus is so configured according to the invention that a signal is coupled into the apparatus in via which triggering and/or the sequence of the diagnostic functions are modified.

A known OBD-capable control apparatus has an interface via which the data (for example, fault announcements occurring during the diagnostic sequence) are transmitted to an external tester. The apparatus according to the invention is further so programmed that the start conditions under which the diagnosis is triggered can be avoided by a signal from the tester. Additionally, it can be provided that the sequence of the diagnostic method is modified by changing specific test parameters.

An embodiment of the arrangement of the invention functions in the manner as shown in the left half of FIG. 2. The right half shows method steps which are run through parallel in an external test apparatus during the work of the arrangement of the invention. The test apparatus is connected via an interface to the arrangement according to the invention.

After the start of the engine, the control apparatus operates in a main program (block S1) in which, for example, operations such as triggering the ignition and injection-time computations are coordinated.

In everyday operation, the program continues with the following steps: a variable Bfa, which can assume values of zero or one, has the standard value zero after the start and a set of test parameters has the standard values a1, . . . an. In step S2, a check is made as to whether the variable Bfa has the value one. In everyday operation, this inquiry is answered in the negative which is evaluated as a start precondition (step S3) for the conventional on-board diagnosis. Thereafter, in step S4, a check is made as to whether the start conditions for triggering the on-board diagnosis are satisfied. For example, such conditions are the presence of a minimum temperature of the cooling water, the elapse of a certain time span after the start of the engine and so on. As long as these conditions are not satisfied, there is a return into the main program. If, in contrast, these conditions are satisfied, then, in step S5, the set of test parameters a1, . . . an is read in and in step S6, the normal OBD function is executed with these test parameters. The result of the diagnosis is evaluated in step S7 wherein a fault lamp MIL is switched on for serious faults or, for less serious faults, a fault counter reading is increased.

In step S8, the main program is thereafter continued.

In the case of an assembly line end test, a signal is coupled into the control apparatus 4 from the external test apparatus 5 via an interface. With this signal, the value of the variable Bfa is changed from the value zero to the value one in the control apparatus (step T1). The subsequent inquiry in step S2 is then answered in the affirmative whereupon the control apparatus branches into an assembly band end diagnostic mode (step S9). This branch detours around the start conditions to which the diagnosis is coupled in everyday operation. If desired, test parameters can also be changed in this branch. For this, step T2 takes place in which the external test apparatus activates a changed set of test parameters b1, . . . bn in the control apparatus 4 or transfers the same to the control apparatus. In any event, the control apparatus 4 works in step S6 through the otherwise unchanged OBD functions with this changed set (step S10). If faults occur, these are determined in step S7 and the external tester is signaled.

In this way, and in relation to the above-described OBD function for checking a tank-venting valve, the check can be triggered without delay by the test apparatus 5 without waiting times. To preclude interacting influences with other OBD functions to other vehicle component systems, the signal coupled in from test apparatus 5 can serve to suppress the automatic triggering of OBD functions by the control apparatus. The invention is not limited to a diagnosis of tank venting or of the blowing in of secondary air; instead, the invention can be applied in combination with every OBD function of other component systems. Examples of other component systems which are here pertinent are the fuel-supply system, monitoring of a catalytic converter, monitoring of a lambda probe as to deterioration, the load detection system, a system for detecting combustion misfires, a diagnosis of sensors. What is above all essential is that the on-board diagnostic functions are triggered independently of other start conditions by an external test apparatus and, if required, can be modified in their sequence.

We claim:

1. A combination of an on-board diagnostic arrangement for checking component systems of a motor vehicle and an external test apparatus, the combination comprising:

said arrangement including means for triggering and executing a plurality of test functions during operation of said vehicle to test said component systems for a predetermined testing time duration in accordance with a first set of parameters (a1, . . . an) and in dependence upon predetermined start conditions;

said external test apparatus including means for generating a signal to inhibit the triggering of said test functions;

an interface for coupling said signal into said arrangement to inhibit said test functions;

means for providing a second set of parameters (b1, . . . bn) for executing at least one of said test functions without said predetermined start conditions and in a sequence modified to reduce said predetermined testing time duration; and, said external test apparatus including means for activating said second set of parameters (b1, . . . bn) via said interface thereby triggering said at least one test function for execution by said arrangement in accordance with said second set of parameters (b1, . . . bn).

2. The combination of claim 1, wherein said second set of parameters (b1, . . . bn) is stored in said arrangement.

3. The combination of claim 1, wherein said second set of parameters (b1, . . . bn) is stored in said external test apparatus and transferred to said arrangement via said interface.

4. The combination of claim 1, wherein one of said component systems is a tank-venting system.

5. The combination of claim 1, wherein one of said component systems is a secondary-air system.

6. The combination of claim 1, wherein said component systems include at least one of the following: a fuel-supply system, a system for monitoring the catalytic converter, a system for monitoring the lambda probe as to deterioration, a load detection system, a system for detecting misfires and a system for diagnosing a sensor.

* * * * *